United States Patent
Kouzaki

(10) Patent No.: US 8,196,084 B2
(45) Date of Patent: Jun. 5, 2012

(54) VOLTAGE FLUCTUATION ESTIMATING METHOD AND APPARATUS, SEMICONDUCTOR DEVICE OPERATION VERIFICATION APPARATUS, SEMICONDUCTOR DEVICE DESIGNING METHOD, PRINTED CIRCUIT BOARD DESIGNING METHOD, AND PROGRAM

(75) Inventor: Yasuo Kouzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 285 days.

(21) Appl. No.: 12/505,616

(22) Filed: Jul. 20, 2009

(65) Prior Publication Data
US 2010/0023909 A1    Jan. 28, 2010

(30) Foreign Application Priority Data

Jul. 28, 2008 (JP) ................................. 2008-193663

(51) Int. Cl.
*G06F 17/50* (2006.01)
(52) U.S. Cl. ......................... 716/133; 716/115; 716/136
(58) Field of Classification Search .................. 716/115, 716/119, 127, 133, 136
See application file for complete search history.

(56) References Cited

U.S. PATENT DOCUMENTS

2002/0017907 A1 * 2/2002 Araki et al. .................... 324/548
2005/0005254 A1   1/2005 Hirano et al.

FOREIGN PATENT DOCUMENTS

JP       2005-004245 A       1/2005

OTHER PUBLICATIONS

Korean Office Action dated Nov. 30, 2011, issued in corresponding Korean Patent Application No. 10-2009-0068379.

* cited by examiner

*Primary Examiner* — Vuthe Siek
(74) *Attorney, Agent, or Firm* — Westerman, Hattori, Daniels & Adrian, LLP

(57) ABSTRACT

A computer determines a first relationship between a maximum frequency of the semiconductor device and an internal power supply voltage of the semiconductor device. Then, the computer determines a second relationship between the maximum frequency and an amount of noise, based on a number of the input/output signal pins. In addition, the computer estimates a fluctuation of the internal power supply voltage corresponding to a amount of noise of the semiconductor device, based on the first relationship and the second relationship. Then, the computer performs a design change of the semiconductor device based on the estimated fluctuation. And the computer stores the changed design of the semiconductor device to a storage device.

4 Claims, 8 Drawing Sheets

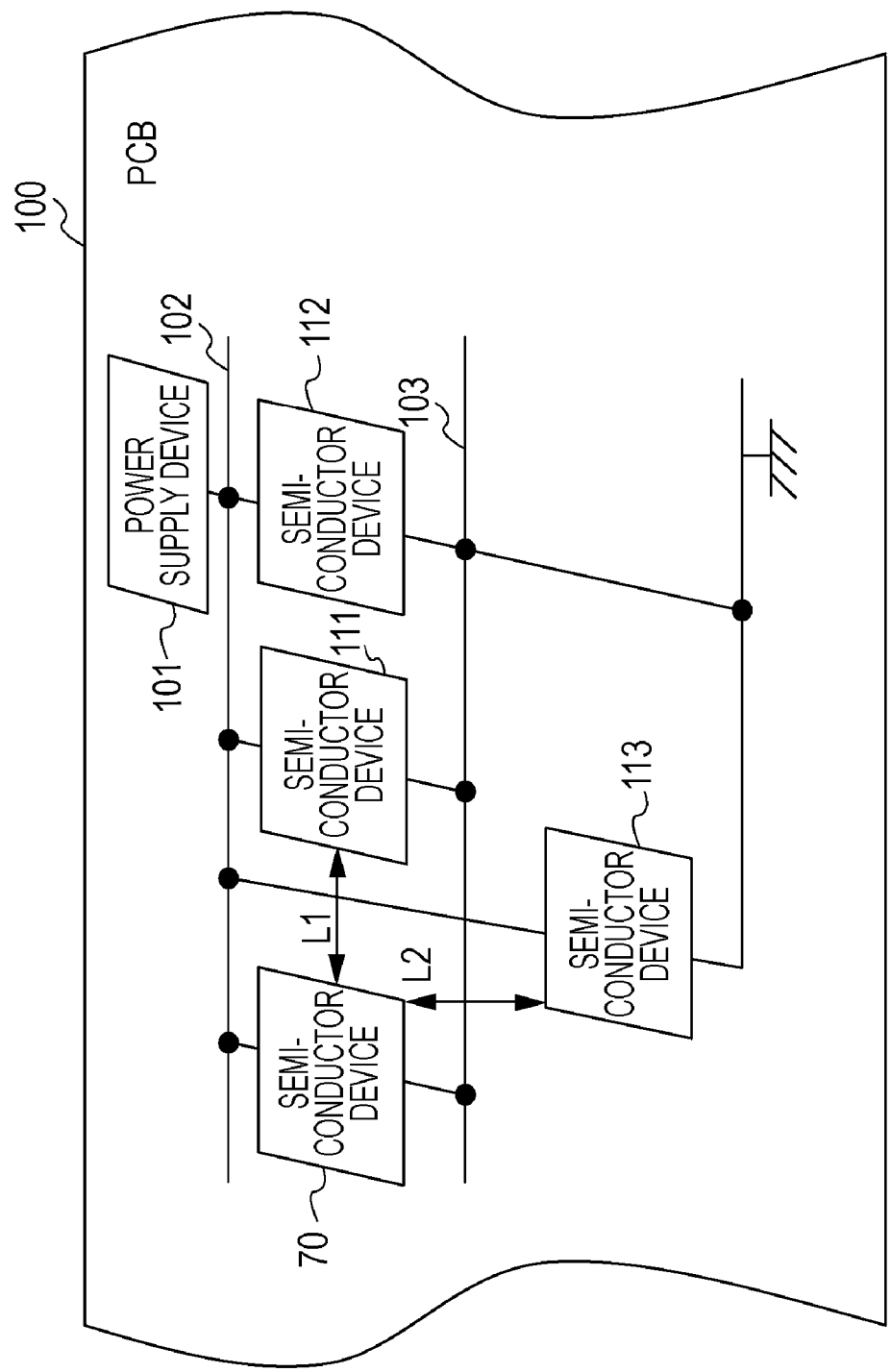

VOLTAGE FLUCTUATION ESTIMATING METHOD AND APPARATUS, SEMICONDUCTOR DEVICE OPERATION VERIFICATION APPARATUS, SEMICONDUCTOR DEVICE DESIGNING METHOD, PRINTED CIRCUIT BOARD DESIGNING METHOD, AND PROGRAM

CROSS-REFERENCE TO RELATED APPLICATION

This application is based upon and claims the benefit of priority of the prior Japanese Patent Application No. 2008-193663, filed on Jul. 28, 2008, the entire contents of which are incorporated herein by reference.

FIELD

The invention is based on an embodiment which relates to a technique for handling noise that arises in a semiconductor device provided with a plurality of pins through which input/output signals may be input or output.

BACKGROUND

A field programmable gate array (FPGA) is a semiconductor device that allows a user side to freely set (program) the arrangement of pins, I/O signals allocated to the pins and a circuit configuration. For input/output (IO) signals, a standard (LVTTL (low-voltage TTL)/LVCMOS (low-voltage CMOS)/HSTL (high-speed transceiver logic), or the like), an output current value (12 mA/8 mA/4 mA, or the like), and slew rate control (FAST/SLOW) may be set at the user side. For this reason, considerably flexible design may be performed.

When I/O signals allocated to the pins simultaneously operate, noise called SSO (Simultaneous Switching Output) noise is generated. The SSO noise propagates into the FPGA, and induces erroneous operation of a circuit configured in the FPGA. For this reason, to cause the FPGA to appropriately operate, that is, to appropriately perform the design for the FPGA, it is also presumably important that not only the amount of generated SSO noise is estimated but also the influence of SSO noise on the circuit is estimated quantitatively. In addition, it is also important to appropriately reflect the estimated result on the design (programming).

In the FPGA, with an increase in the number of pins or an increase in speed of circuit operation, the degree of influence of SSO noise have been further increasing. With the above background, it is presumably highly important to appropriately handle SSO noise in the future.

[Patent Document 1] Japanese Unexamined Patent Application Publication No. 2005-4245.

SUMMARY

According to an aspect of the invention, a computer determines a first relationship between a maximum frequency of the semiconductor device and an internal power supply voltage of the semiconductor device. Then, the computer determines a second relationship between the maximum frequency and an amount of noise, based on a number of the input/output signal pins. In addition, the computer estimates an fluctuation of the internal power supply voltage corresponding to a amount of noise of the semiconductor device, based on the first relationship and the second relationship. Then, the computer performs a design change of the semiconductor device based on the estimated fluctuation. And, the computer stores the changed design of the semiconductor device to a storage device.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 10 is a view for illustrating a design change performed on a printed circuit board.

DESCRIPTION OF EMBODIMENT

It is a first object of an embodiment to provide a technique for quantifying the influence of SSO noise generated in a semiconductor device provided with a plurality of pins through which input/output signals may be input or output.

In addition, it is a second object of the embodiment to provide a technique for appropriately handling SSO noise.

Figure 1:
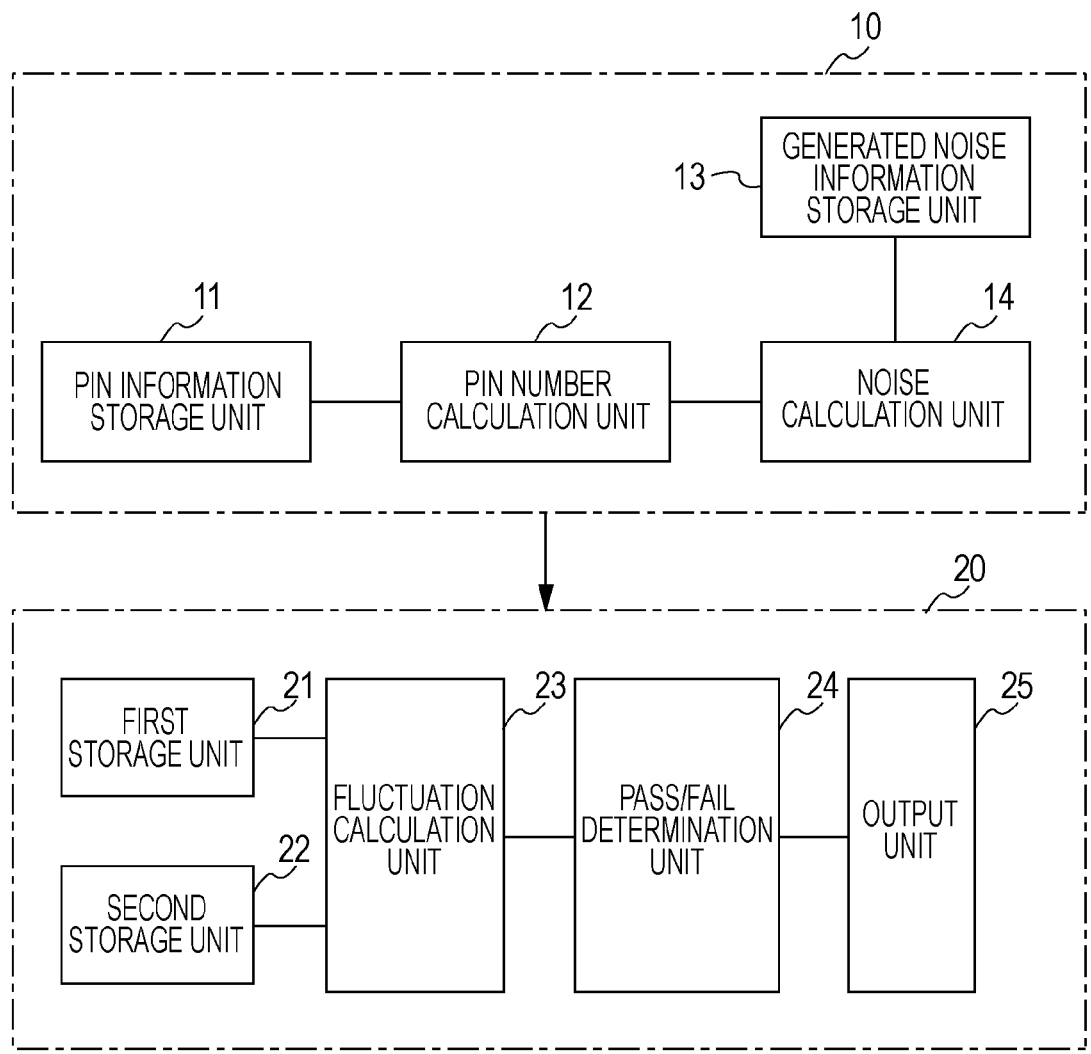
FIG. 1 is a view that shows the configuration of a system constructed using a voltage fluctuation estimating apparatus according to an embodiment.

FIG. 1 is a view that shows the configuration of a system constructed using a voltage fluctuation estimating apparatus according to an embodiment. The system assumes a semiconductor device that may be designed (programmed) and provided with a large number of pins, such as an FPGA, as an analysis target, and is constructed in a form such that a voltage fluctuation estimating apparatus 20 and an SSO noise estimating apparatus 10 are connected as shown in FIG. 1.

The SSO noise estimating apparatus 10 includes a pin information storage unit 11, a pin number calculation unit 12, a generated noise information storage unit 13 and a noise calculation unit 14. In addition, the voltage fluctuation estimating apparatus 20 includes a first storage unit 21, a second storage unit 22, a fluctuation calculation unit 23, a pass/fail determination unit 24 and an output unit 25.

The SSO noise estimating apparatus 10 and the voltage fluctuation estimating apparatus 20 each are implemented by executing an exclusive application program (hereinafter, simply referred to as "application") on a data processing apparatus, such as a computer. The application may be separately prepared or may be integrated as one. In the case of the single application (the application that is able to implement both the SSO noise estimating apparatus 10 and the voltage fluctuation estimating apparatus 20), a system provided with apparatuses 10 and 20 may be implemented on one computer. The voltage fluctuation estimating apparatus 20 may be implemented by executing an application, so the application may be stored in a computer-accessible storage medium, such as an optical disc, a flash memory and a hard disk drive, and distributed. The application may be received by a computer through a communication network.

First, the SSO noise estimating apparatus 10 will be described with reference to FIG. 2. The SSO noise estimating apparatus 10 estimates the amount of SSO noise generated when IO signals of the other pins simultaneously operate for each pin provided for the semiconductor device (for example, FPGA).

The pin information storage unit 11 stores pin information that includes position information indicating an arranged position and IO user setting information related to an allocated IO signal for each pin. The pin information for each pin is obtained from the result of design of the semiconductor device. The IO user setting information is related to an IO signal set at a user side and includes a standard (LVTTL (low-voltage TTL)/LVCMOS (low-voltage CMOS)/HSTL (high-speed transceiver logic), or the like), an output current value (12 mA/8 mA/4 mA, or the like), slew rate control (FAST/SLOW), and the like, of the IO signal.

Figure 2:
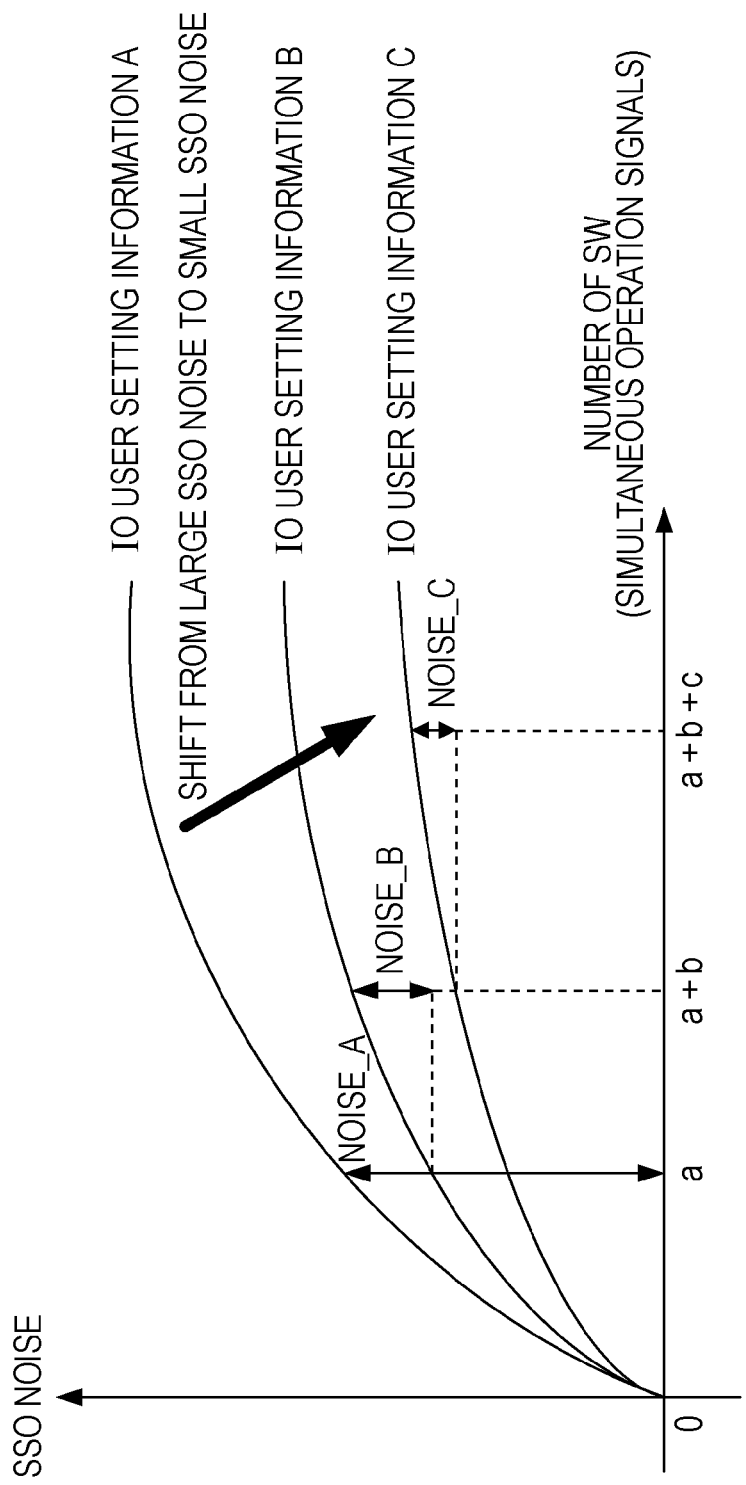
FIG. 2 is a view that illustrates a method of estimating the amount of SSO noise.

FIG. 2 is a view that illustrates a method of estimating the amount of SSO noise. In the graph shown in FIG. 2, the abscissa axis represents the number of IO signals (pins) that operate simultaneously ("number of SW (simultaneous operation signals" in the drawing), and the ordinate axis represents the amount of possible SSO noise (specifically, for example, a variation in voltage level, a voltage ratio of an IO signal to the amount of possible noise, or the like). Thus, the graph shows a variation in the amount of possible SSO noise due to the number of IO signals that operate simultaneously. Information that indicates a variation in the amount of possible SSO noise due to IO signals is stored in the generated noise information storage unit 13 as generated noise information.

The amount of generated SSO noise varies depending on IO signals. Therefore, the generated noise information is prepared for each of the pieces of user setting information having at least different standards or output current values. FIG. 2 shows three pieces of generated noise information in total, that is, different pieces of user setting information A to C having mutually different IO signals.

Figure 3:
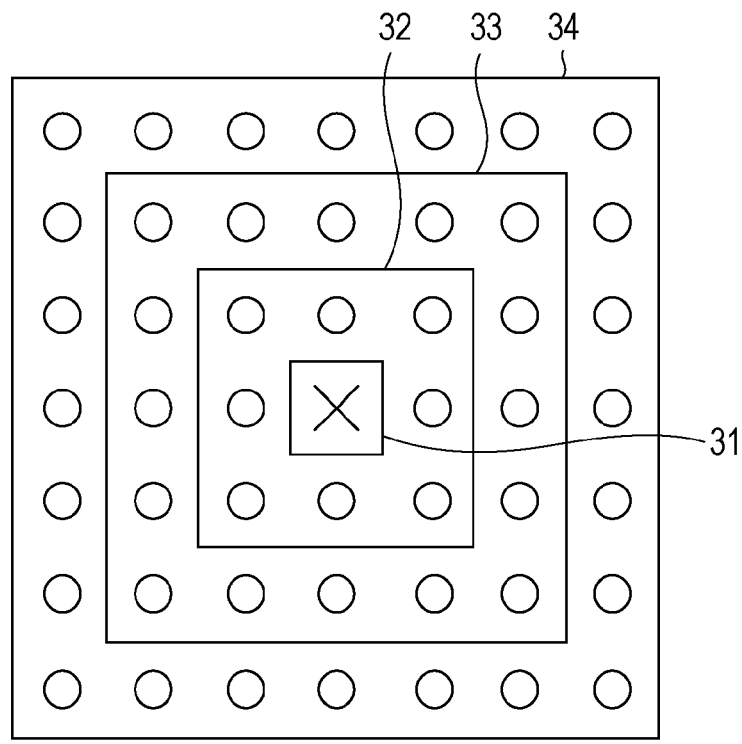
FIG. 3 is a view for illustrating a method of generating information about generated noise.

FIG. 3 is a view for illustrating a method of generating generated noise information. "×" and "O" shown in FIG. 3 each indicate a pin. The pin indicated by "×" is a target pin of which the amount of SSO noise is estimated.

The pins considered to estimate the amount of SSO noise generated at that target pin are grouped on the basis of the positional relationship with the target pin.

The example shown in FIG. 3 shows that pins present around the target pin are grouped as follows.

(a) A group of pins that are present in a one-pin width area 32 located on the outer side of an area 31 in which the target pin is present (first group)

(b) A group of pins that are present in a one-pin width area 33 located on the outer side of the area 32 (second group)

(c) A group of pins that are present in a one-pin width area 34 located on the outer side of the area 33 (third group)

In the case of the present embodiment, the numbers of maximum pins in the respective groups are 8 in the first group, 16 in the second group and 24 in the third group.

SSO noise is generated at the target pin due to IO signals that are input to or output from the pins. The amount of SSO noise varies depending on a distance from the target pin. As a location gets close to the target pin, the amount of generated SSO noise increases. For this reason, the generated noise information shown in FIG. 2 is obtained by measuring the amount of SSO noise while increasing the number of pins starting from the first group. Thus, in the example shown in FIG. 3, the generated noise information may be obtained by measuring the amount of SSO noise in such a manner that the number of pins is increased only in the first group between 1 to 8 pins, the number of pins is increased only in the second group between 9 to 24 pins and the number of pins is increased only in the third group between 25 to 48 pins. In any of the pieces of the generated noise information shown in FIG. 2, a gradient increases as the number of pins decreases. Thus, it appears that the closer the pin is located to the target pin, the larger the amount of SSO noise which is generated.

The generated noise information as shown in FIG. 2 is stored in the generated noise information storage unit 13 for each piece of IO user setting information. The amount of SSO noise using those pieces of generated noise information is estimated as follows.

The amount of generated SSO noise varies depending on an IO signal. Thus, the pin number calculation unit 12 refers to pin information of each pin stored in the pin information storage unit 11 to calculate the number of pins for each IO user setting information. For the target pin indicated by "×" in FIG. 3, the number of pins present in any of the areas 32 to 34 is calculated for each IO user setting information. The number of pins calculated for each IO user setting information is provided to the noise calculation unit 14. In FIG. 2, a to c indicated in the abscissa axis represent the number of pins calculated for respective pieces of IO user setting information A to C.

The noise calculation unit 14 reads the generated noise information of the IO user setting information, to which the number of pins is provided, from the generated noise information storage unit 13 and estimates the amount of possible SSO noise generated at the target pin. The estimation is carried out in such a manner that the amount of possible SSO noise is calculated for each piece of IO user setting information and then the calculated amount of SSO noise is accumulated.

The amount of SSO noise for each piece of IO user setting information is calculated by allocating a corresponding interval in the generated noise information to each IO user setting information. When the numbers of pins calculated for the respective pieces of IO user setting information A to C are a to c, as shown in FIG. 2, the interval of 0 to a is allocated to the IO user setting information A, the interval of a to a+b is allocated to the IO user setting information B, and the interval of a+b to a+b+c is allocated to the IO user setting information C. Thus, a value obtained by subtracting the amount of SSO noise when the number of pins is 0 from the amount of SSO noise when the number of pins is a is calculated as the amount of possible SSO noise Noise_A for the user setting information A. Similarly, a value obtained by subtracting the amount of SSO noise when the number of pins is a from the amount of SSO noise when the number of pins is a+b is calculated as the amount of possible SSO noise Noise_B for the user setting information B, and a value obtained by subtracting the amount of SSO noise when the number of pins is a+b from the amount of SSO noise when the number of pins is a+b+c is calculated as the amount of possible SSO noise Noise_C for the user setting information C. An accumulated value of these amounts of SSO noise Noise_A, Noise_B and Noise_C is the amount of SSO noise estimated for the target pin.

The corresponding interval is allocated to a position of which the number of pins is smaller for the IO user setting information that causes a larger amount of possible SSO noise. This is to avoid a situation that the estimated amount of SSO noise is smaller than the actual amount of noise.

Next, the voltage fluctuation estimating apparatus 20 will be described in detail.

Figure 7:
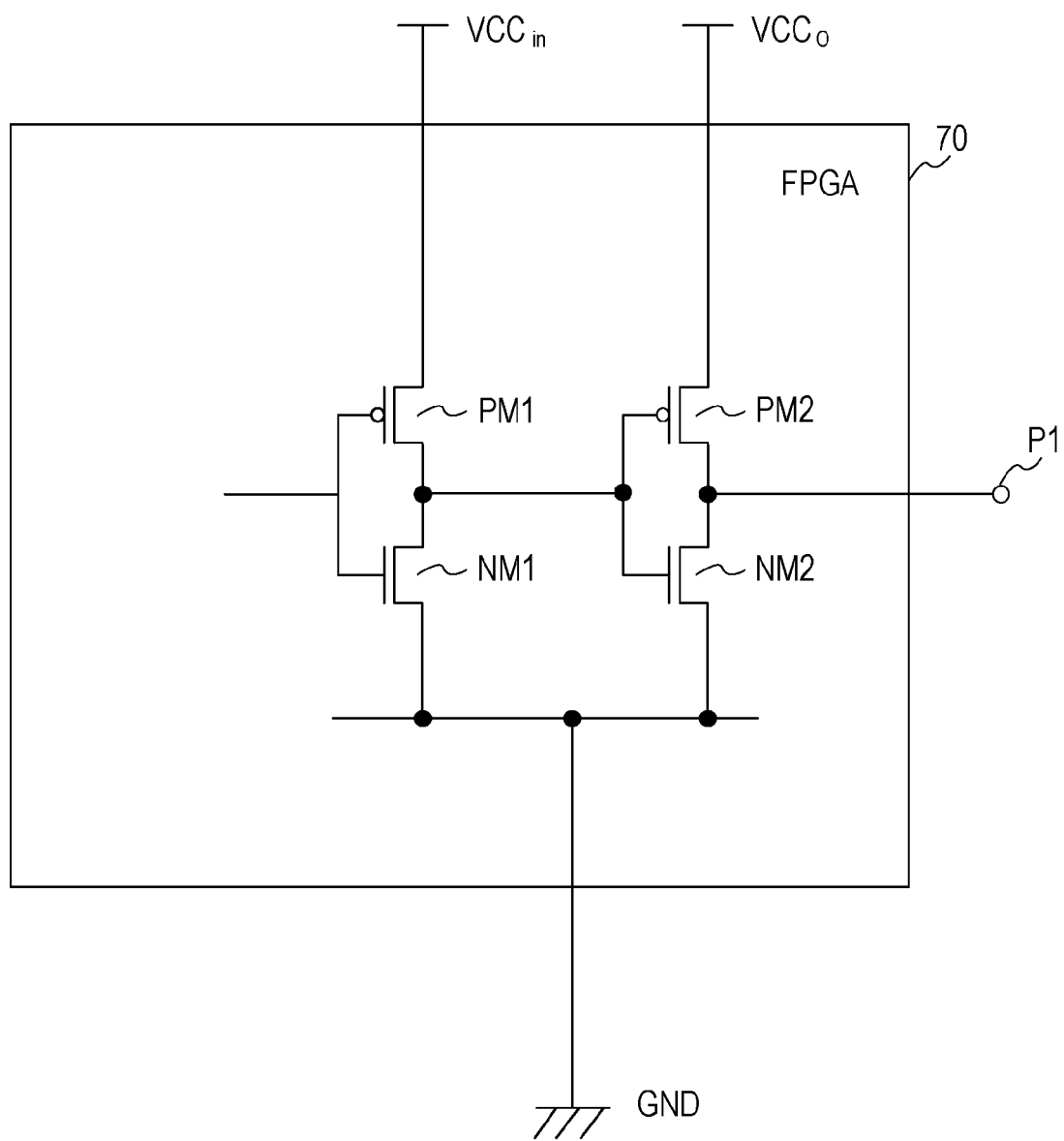
FIG. 7 is a view for illustrating a fluctuation in internal power supply voltage, generated in an FPGA.

FIG. 7 is a view for illustrating a fluctuation in internal power supply voltage, generated in the FPGA. VCCin and VCCo shown in FIG. 7 each indicate an internal power supply voltage. A CMOS (hereinafter, referred to as "first CMOS") formed of a P-channel MOSFET (hereinafter, referred to as "PMOS transistor") PM1 and an N-channel MOSFET (hereinafter, referred to as "NMOS transistor") NM1 is configured so that the internal power supply voltage VCCin is applied to the source of the PMOS transistor PM1 and the source of the NMOS transistor NM1 is connected to a ground (GND). The same signal is input to each of the gates of the PMOS transistor PM1 and NMOS transistor NM1.

On the other hand, a CMOS (hereinafter, referred to as "second CMOS") formed of a PMOS transistor PM2 and an NMOS transistor NM2 is configured so that the internal power supply voltage VCCO is applied to the source of the PMOS transistor PM2 and the source of the NMOS transistor NM2 is connected to the ground. Each of the gates of the PMOS transistor PM2 and NMOS transistor NM2 is connected to the drain of the PMOS transistor PM1 that constitutes the first CMOS. The source of the PMOS transistor PM2 is connected to a pin P1.

A circuit that includes the first and second CMOSs is configured in an FPGA 70 through design. A signal output from the pin P1 is L (low) when the first CMOS, that is, an input signal of each of the gates of the PMOS transistor PM1 and NMOS transistor NM1 is H (high), and is H when the input signal is L. Thus, the circuit has the function of an inverter.

When the level of the input signal changes from H to L or L to H, an electric current that flows from the first or second CMOS to the ground changes. The change in electric current changes the voltage level of the ground. Thus, SSO noise occurs at the ground.

The change in voltage level at the ground is generated in a direction to increase the voltage level. Thus, a potential difference between the ground and the internal power supply voltage reduces and, therefore, the internal power supply voltage apparently decreases. The threshold level of a signal in a digital circuit further rises. Thus, the change in voltage level at the ground is equivalent to a fluctuation (decrease) in internal power supply voltage.

An equivalent fluctuation (decrease) in internal power supply voltage influences operations of the circuit. The fluctuation induces inconvenience, such as a logical malfunction that the circuit does not operate normally and a timing error that each signal does not operate in a prescribed period of time. Thus, in the design (programming) of the FPGA, or the like, it is necessary to consider such an equivalent fluctuation in internal power supply voltage. For this reason, the voltage fluctuation estimating apparatus 20 estimates an equivalent fluctuation in internal power supply voltage to be implemented as an apparatus that quantifies the influence of SSO noise for assisting the design. Hereinafter, unless otherwise specified, a fluctuation in internal power supply voltage is used to mean an equivalent fluctuation.

A fluctuation in internal power supply voltage is estimated using the information stored in each of the first and second storage units 21 and 22. Those pieces of information will be specifically described with reference to FIG. 4 and FIG. 5.

Figure 4:
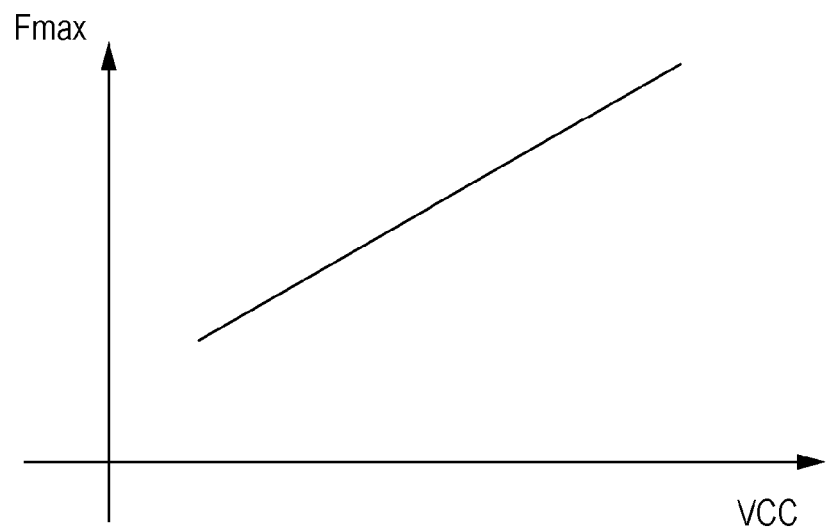
FIG. 4 is a view that shows a variation in maximum operating frequency of an internal circuit due to an internal power supply voltage.

FIG. 4 is a view that shows a variation in maximum operating frequency of an internal circuit due to an internal power supply voltage. The ordinate axis represents a frequency, and the abscissa axis represents a voltage. Thus, FIG. 4 shows dependence of the maximum operating frequency, which is an upper limit to which the internal circuit operates normally, due to an internal power supply voltage. In FIG. 4, VCC indicates an internal power supply voltage, and Fmax indicates a maximum operating frequency.

The internal circuit is a circuit for measuring a maximum operating frequency of a shift register, a counter, or the like, that operates on clock. As shown in FIG. 4, as the internal power supply voltage rises, the maximum operating frequency tends to further rise. The information that indicates such dependence is stored in the first storage unit 21. Hereinafter, the information is termed "voltage dependence information".

The voltage dependence information is acquired in such a manner that, for example, the internal circuit that operates on clock is configured in the FPGA and then the clock is supplied through PLL, or the like, to monitor operations of the internal circuit. For each of the different internal power supply voltages, the voltage dependence information is acquired by measuring a maximum operating frequency while changing the frequency of clock. In addition, the voltage dependence information may be acquired through simulation.

Figure 5:
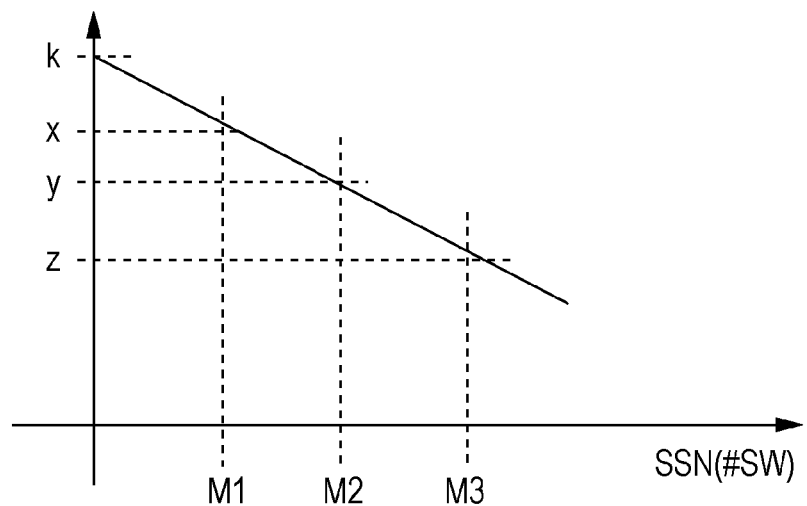
FIG. 5 is a view that shows a variation in maximum operating frequency of the internal circuit against SSO noise.

FIG. 5 is a view that shows a variation in maximum operating frequency of the internal circuit against SSO noise. The ordinate axis represents a frequency, and the abscissa axis represents noise. In FIG. 5, SSO indicates noise, #SW indicates the number of pins that operate IO signals simultaneously. SSO and #SW are written side by side because SSO noise tends to increase as the number of pins that operate IO signals simultaneously is increased. Hereinafter, the number of pins that operate IO signals simultaneously is termed "the number of SSOS".

As shown in FIG. 5, the maximum operating frequency of the internal circuit decreases as SSO noise increases. The information that indicates a variation in maximum operating frequency due to such SSO noise is stored in the second storage unit 22. Hereinafter, the information is termed "noise dependence information". In FIG. 5, M1 to M3 shown on the abscissa axis and x, y and z shown on the ordinate axis respectively show the amounts of different noise and maximum operating frequencies measured at the respective amounts of noise. k indicates a maximum operating frequency when the amount of noise is 0.

The noise dependence information is acquired in such a manner that, for example, the internal power supply voltage is constant and then the maximum operating frequency and the amount of SSO noise are measured while changing the number of SSOs. At this time, the phase of clock is scanned to obtain the worst case of each of the maximum operating frequency and amount of SSO noise. As shown in FIG. 7, a plurality of types of internal power supply voltages are usually present, so the noise dependence information is prepared for each of the types of internal power supply voltages.

A pin that does not input or output an IO signal is used to accurately measure the amount of SSO noise. The number of SSOs is changed, for example, using a similar method to that of acquisition of the generated noise information. That is, the number of SSOs is changed in such a manner that the target pin for which the amount of SSO noise is estimated is used for measuring the amount of SSO noise and then pins are allocated from an area closer to the target pin.

Figure 8:
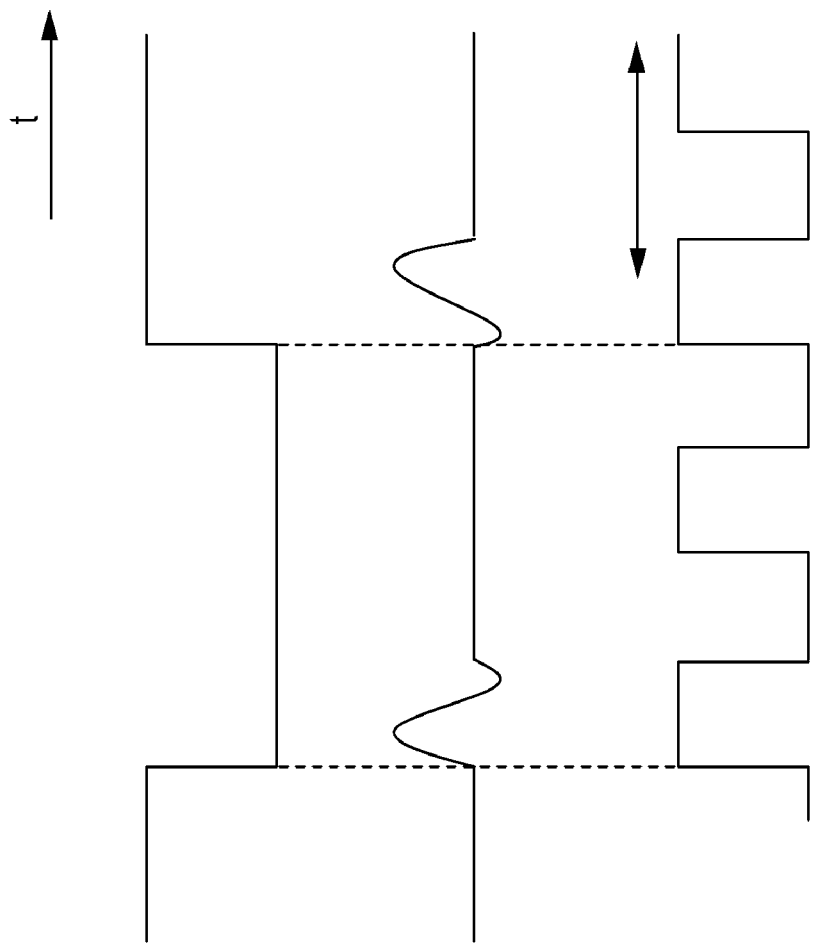
FIG. 8 is a view that illustrates scanning of the phase of clock performed when the maximum operating frequency and the amount of SSO noise are measured.

FIG. 8 is a view that illustrates scanning of the phase of clock performed when the maximum operating frequency and the amount of SSO noise are measured. The operating output indicates a variation over time of a signal output from the internal circuit, and the output pin indicates a variation over time of a voltage of a pin used for measuring the amount of SSO noise.

In FIG. 8, the operating output varies in synchronization with clock, and the voltage of the output pin temporarily fluctuates due to SSO noise generated in accordance with the variation in operating output. However, a variation in voltage at the output pin also occurs due to IO signals that are input or output through other pins in addition to the internal circuit. Thus, the amount of SSO noise depends on a timing at which an operation of the internal circuit changes and/or a timing at which IO signals that are input or output at other pins change. The maximum operating frequency may vary depending on the amount of SSO noise. For this reason, the phase of clock is scanned to change the timing at which the internal circuit operates to search for the worst case of the maximum operating frequency and the amount of SSO noise. The phase of clock is scanned in such a manner that the clock waveform shown in FIG. 8 is shifted in two directions indicated by the arrow along the time axis.

The amount of SSO noise estimated by the SSO noise estimating apparatus 10 is, for example, input by the pass/fail determination unit 24, and is provided to the fluctuation calculation unit 23. The fluctuation calculation unit 23 to which the amount of SSO noise is provided reads the voltage dependence information and the noise dependence information from the first and second storage units 21 and 22, and uses the two pieces of information to calculate a fluctuation in internal power supply voltage.

Figure 6:
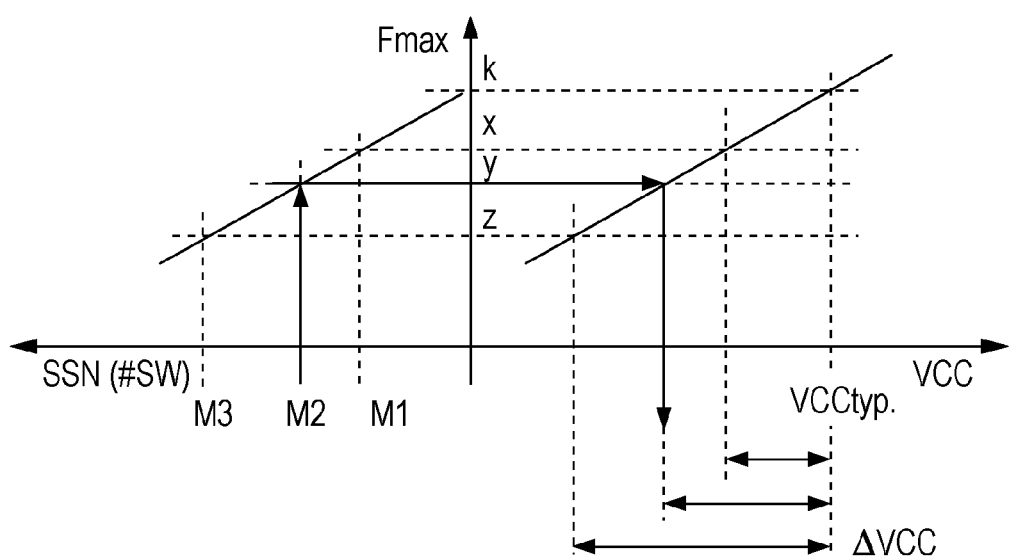
FIG. 6 is a view that illustrates a method of calculating a fluctuation in internal power supply voltage.

FIG. 6 is a view that illustrates a method of calculating a fluctuation in internal power supply voltage. FIG. 6 shows a graph that illustrates the voltage dependence information on the right side of the ordinate axis and a graph that illustrates the noise dependence information on the left side of the ordinate axis. The noise dependence information is shown so that the abscissa axis represents noise, but a direction in which noise increases is reversed from that of FIG. 5.

VCCtyp in FIG. 6 indicates a target internal power supply voltage for which a fluctuation is calculated. The type of the target internal power supply voltage is, for example, provided from the SSO noise estimating apparatus 10 together with the amount of SSO noise. The type of the internal power supply voltage is identified on the basis of an IO signal indicated by the IO user setting information set for the target pin. The position on the abscissa axis on which the VCCtyp is indicated indicates a voltage value of the internal power supply voltage in which no fluctuation is generated. For this reason, the VCCtyp is also used to mean the voltage value.

Calculation of the fluctuation first refers to the noise dependence information to determine a maximum operating frequency corresponding to the amount of SSO noise provided. Then, a voltage corresponding to the maximum operating frequency is determined with reference to the voltage dependence information. Lastly, for example, a differential $\Delta$VCC obtained by subtracting the determined voltage value from the voltage value VCCtyp of the internal power supply voltage is calculated. The differential $\Delta$VCC is returned to the pass/fail determination unit 24 as a fluctuation.

The noise dependence information and the voltage dependence information each indicate dependence related to the maximum operating frequency. Thus, using the maximum operating frequency as a parameter, a corresponding fluctuation in internal power supply voltage is estimated on the basis of the estimated amount of SSO noise. Each piece of information indicates the characteristics of the FPGA, so the accuracy of estimating a fluctuation in internal power supply voltage is also reliable.

The pass/fail determination unit 24 determines pass or fail by checking whether the returned fluctuation (differential $\Delta$VCC) falls within a predetermined allowable range. The allowable range determined for pass/fail determination is, for example, the amount of drop in internal power supply voltage by which the circuit configured in the FPGA 70 is presumably likely to operate normally. Thus, the fail/pass determination corresponds to determining whether the circuit operates normally. Thus, fail determination means that it is necessary to change the design of the FPGA 70. The result of pass/fail determination is output by the output unit 25. Output of the determination result by the output unit 25 is carried out by displaying the result on a display device, transmitting the result to an external device through a communication network or storing the result in a storage medium.

Various types of verification are carried out in circuit design. This also applies to the semiconductor device, such as the FPGA 70. One type of verification includes a timing analysis for determining, on the basis of a difference in time at which signals propagate, whether inconvenience (malfunction of the circuit, or the like) occurs. Thus, timing design in consideration of propagation of signals is carried out so as not to cause inconvenience.

A fluctuation in internal power supply voltage influences the result of timing analysis. This is because the timing at which a signal rises or falls changes depending on a fluctuation in internal power supply voltage. Therefore, the allowable range for pass/fail determination may be the one that takes into consideration the amount of an allowable voltage drop in terms of timing design. It is also applicable that a plurality of allowable ranges in consideration of a plurality of different viewpoints are prepared, and pass/fail determination is performed in each allowable range. The prepared allowable range may be the one other than the above.

The amount of SSO noise varies depending on arrangement (allocation) of pins through which IO signals are input or output. For this reason, the design change of the FPGA 70 may be handled by changing the arrangement of the pins. If it is possible to handle the design change by changing the paths through which signals propagate, it is possible to handle the design change through timing design. In addition, the following handling is also possible.

Figure 9:
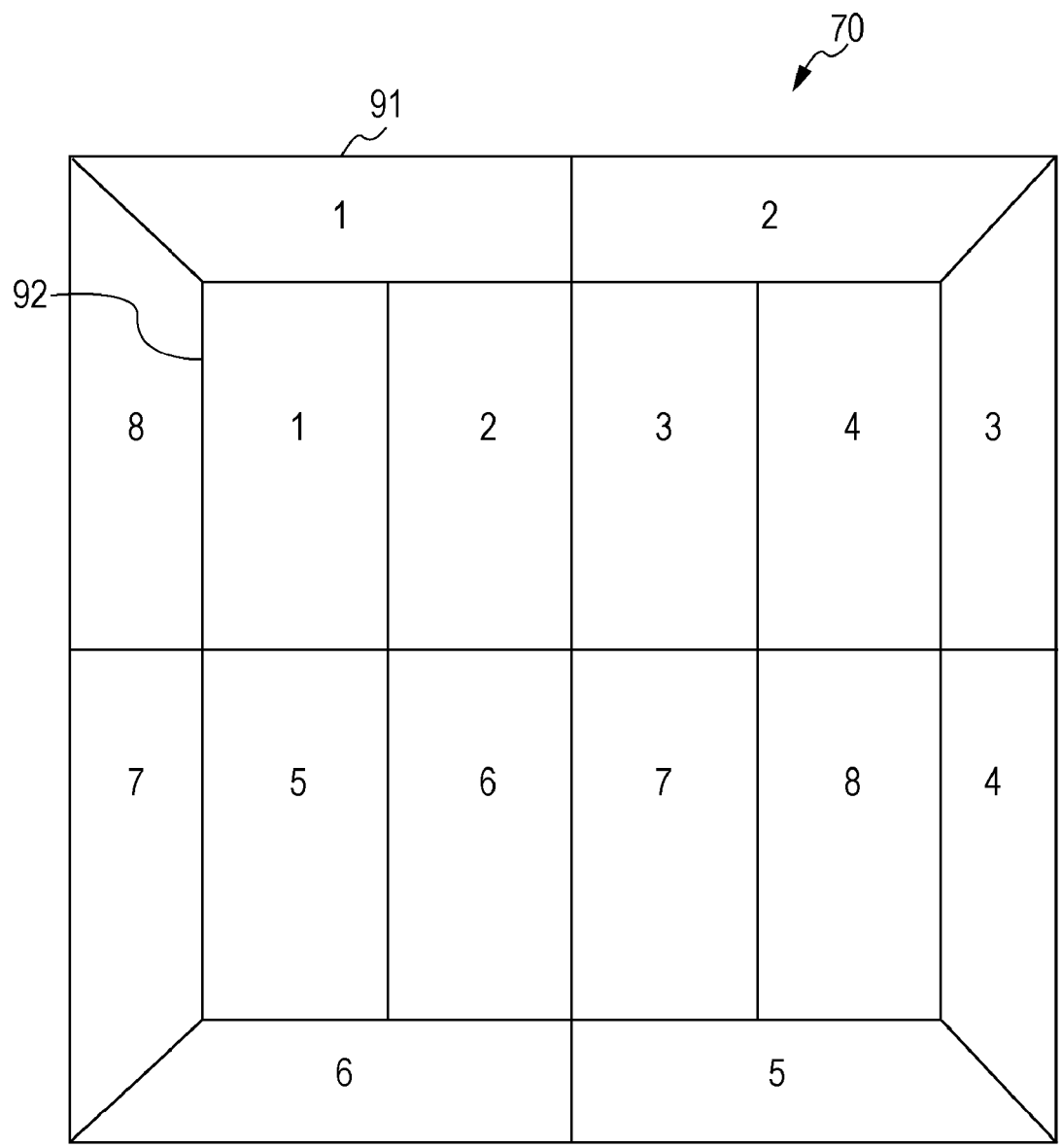
FIG. 9 is a view that shows the internal configuration of the FPGA.

FIG. 9 is a view that shows the internal configuration of the FPGA 70. The internal configuration shows a circuit formed in a chip of the FPGA 70. A plurality of banks 91 and regions 92 are present in the chip. The plurality of banks 91 are areas in which input/output circuits for IO signals are formed. The regions 92 are areas that are divided by a clock distribution tree.

The banks 91 are arranged so as to surround the regions 92. The eight banks 91 and the eight regions 92 are present. Each of the banks 91 and regions 92 has any one of assigned numerals 1 to 8. When any one of the banks 91 is indicated, for example, the reference numeral may be suffixed as "91-1", and "91-2" using the assigned numerals. This also applies to the regions 92.

In the internal configuration shown in FIG. 9, the amount of possible SSO noise varies depending on the banks 91. Thus, it may be handled (design change) so that a circuit that operates at a relatively low speed is arranged in the region 92 near the bank 91 of which the amount of SSO noise is large, and a circuit that operates at a relatively high speed is arranged in the region 92 near the bank 91 of which the amount of SSO noise is small. For example, when the amount of possible SSO noise is maximum at the bank 91-3, the circuit that operates at a high speed arranged in the region 92-4 or the regions 92 adjacent to the region 92-4 may be changed in arrangement to a location of the region 92-5 remote from the bank 91-3. By carrying out such design change, inconvenience may be eliminated.

As shown in FIG. 10, the FPGA 70 is mounted on a printed circuit board (PCB) 100 and used. A semiconductor device other than the FPGA 70, for example, another FPGA, a different type of LSI, or the like, is usually mounted on the PCB 100. FIG. 10 shows three semiconductor devices 111 to 113 in total. The reference numeral 101 denotes a power supply device that generates a power supply voltage.

The power supply device 101 is connected to a power supply plane 102. Thus, a power supply voltage is applied to each of the semiconductor devices 70 and 111 to 113 via the power supply plane 102. In addition, the semiconductor devices 70 and 111 to 113 are connected to a ground plane 103.

An equivalent fluctuation in internal power supply voltage generated in the FPGA 70 propagates to the ground plane 103. The influence of the propagation increases as a distance from the FPGA 70 on the ground plane 103 is reduced. Thus, a distance L1 in arrangement from the semiconductor device 111 is substantially equal to a distance L2 in arrangement from the semiconductor device 112; however, the semiconductor device 111 is more influenced by the propagation. Thus, it is desirable that, in consideration of a fluctuation in internal power supply voltage estimated for the FPGA, the arrangement of the other semiconductor devices, that is, a connecting positional relationship in view of the ground plane 103, is designed. Actually, it is desirable to design the arrangement of each semiconductor device in such a manner that a fluctuation in internal power supply voltage is estimated for each semiconductor device and then the estimated fluctuations and operating speeds required for the semiconductor devices.

The influence of an equivalent fluctuation (SSO noise) in internal power supply voltage of a semiconductor device on another semiconductor device is usually analyzed through simulation. However, the analysis requires extremely precise modeling. The power supply voltage fluctuation estimating apparatus 20 estimates an equivalent fluctuation, so it may be used to quantify the influence on another semiconductor device. Thus, it may also be used to verify correlation with analysis through simulation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method for a computer which has storage device, estimating of a noise fluctuation of a semiconductor device which have input/output signal pins, the method comprising;
   determining a first information that indicates a relationship between a maximum frequency of the semiconductor device and an internal power supply voltage of the semiconductor device;
   determining a second information that indicates a relationship between the maximum frequency and an amount of noise, based on a number of the input/output signal pins;
   calculating an equivalent fluctuation of the internal power supply voltage, corresponding to an amount of noise of the semiconductor device, using the first information and the second information.

2. An estimating apparatus that estimates of a noise fluctuation of a semiconductor device which have input/output signal pins, comprising:
   first storage unit for determining first information that indicates a relationship between a maximum frequency of the semiconductor device and an internal power supply voltage of the semiconductor device;
   second storage unit for determining second information that indicates a relationship between the maximum frequency and an amount of noise, based on a number of the input/output signal pins; and
   fluctuation calculation unit for calculating an equivalent fluctuation of the internal power supply voltage, corresponding to an amount of noise of the semiconductor device, using the first information and the second information.

3. The estimating apparatus according to claim 2, further comprising:
   determination unit for determining whether the fluctuation calculated by the fluctuation calculation means falls within an allowable range.

4. A transitory computer readable storage medium storing a program that causes a computer to execute a process of estimating of a noise fluctuation of a semiconductor device which have input/output signal pins, the program causing the computer to execute:
   determining a first information that indicates a relationship between a maximum frequency of the semiconductor device and an internal power supply voltage of the semiconductor device;
   determining a second information that indicates a relationship between the maximum frequency and an amount of noise, based on a number of the input/output signal pins;
   calculating an equivalent fluctuation of the internal power supply voltage, corresponding to a amount of noise of the semiconductor device, using the first information and the second information.

* * * * *